United States Patent
Lee et al.

(10) Patent No.: US 7,841,919 B2
(45) Date of Patent: Nov. 30, 2010

(54) METHOD OF SEALING AN ORGANIC LIGHT EMITTING DISPLAY USING CLOSED LOOP PATTERN OF FRIT PASTE COMPOSITION

(75) Inventors: Seung-Han Lee, Suwon-si (KR); Dong-Hyun Kang, Suwon-si (KR); Jin-Hwan Jeon, Suwon-si (KR); Jin-Woo Park, Suwon-si (KR); Sang-Wook Sin, Suwon-si (KR)

(73) Assignee: Samsung Mobile Display Co., Ltd. (KR)

( * ) Notice: Subject to any disclaimer, the term of this patent is extended or adjusted under 35 U.S.C. 154(b) by 740 days.

(21) Appl. No.: 11/754,938

(22) Filed: May 29, 2007

(65) Prior Publication Data

US 2008/0138653 A1 Jun. 12, 2008

(30) Foreign Application Priority Data

Dec. 6, 2006 (KR) .................. 10-2006-0123372

(51) Int. Cl.
*H01J 9/00* (2006.01)
*H01L 51/56* (2006.01)
(52) U.S. Cl. ......................... 445/25; 445/24
(58) Field of Classification Search ............. 313/512; 445/24, 25
See application file for complete search history.

(56) References Cited

U.S. PATENT DOCUMENTS

| | | | |
|---|---|---|---|
| 3,995,941 A | 12/1976 | Nagahara et al. | |
| 6,555,025 B1 | 4/2003 | Krupetsky et al. | |
| 6,998,776 B2 | 2/2006 | Aitken et al. | |
| 2005/0233885 A1 | 10/2005 | Yoshida et al. | |
| 2006/0082298 A1 | 4/2006 | Becken et al. | |
| 2007/0007894 A1 | 1/2007 | Aitken et al. | |

FOREIGN PATENT DOCUMENTS

| | | |
|---|---|---|
| CN | 1798710 A | 4/2004 |
| EP | 0 520 139 A1 | 2/2008 |
| JP | 2003-123966 | 4/2003 |
| JP | 2003-332061 | 11/2003 |
| JP | 2006-228647 | 8/2006 |

(Continued)

OTHER PUBLICATIONS

Japanese Office Action for Appl. No. JP 2007-071107; Applicant: Samsung Mobile Display Co., Ltd., dated Nov. 17, 2009, 3 pgs.

(Continued)

*Primary Examiner*—Mariceli Santiago
(74) *Attorney, Agent, or Firm*—Knobbe Martens Olson & Bear LLP

(57) ABSTRACT

Disclosed is a method of manufacturing the organic light emitting display apparatus. The method includes preparing a substrate and placing a mask over the substrate. A frit paste composition is disposed on the mask which has a patterned opening. The frit paste composition is pressed to land on the substrate to form a frit paste structure. The frit paste structure is pre-sintered. Another substrate on which an array of pixels is formed is arranged to oppose the substrate on which the frit structure is formed, and then the substrates are coupled with the frit structure.

11 Claims, 8 Drawing Sheets

FOREIGN PATENT DOCUMENTS

| | | |
|---|---|---|
| KR | 10-2006-0005369 A | 1/2006 |
| WO | 03/005774 A1 | 1/2003 |
| WO | 2004/095597 A2 | 11/2004 |
| WO | 2005/050751 A2 | 6/2005 |

OTHER PUBLICATIONS

Search Report issued on Dec. 20, 2007 in corresponding European patent application No. 07115069.2 in 9 pages.
Office Action issued Oct. 8, 2007 in corresponding Korean patent application No. 10-2006-0123372 in 4 pages.

METHOD OF SEALING AN ORGANIC LIGHT
EMITTING DISPLAY USING CLOSED LOOP
PATTERN OF FRIT PASTE COMPOSITION

CROSS-REFERENCE TO RELATED APPLICATION

This application claims the benefit of Korean Patent Application No. 10-2006-0123372, filed on Dec. 6, 2006, in the Korean Intellectual Property Office, the disclosure of which is incorporated herein by reference in its entirety.

BACKGROUND

1. Field

The present invention relates to an organic light emitting display apparatus, and more particularly, to encapsulating an organic light emitting display apparatus with frit seal.

2. Discussion of the Related Technology

Cathode ray tube (CRT) display apparatuses are now being replaced by portable thin flat panel display apparatuses. Among such flat panel display apparatuses, electroluminiscent display apparatuses are emissive display apparatuses that are attracting attention as the next generation of display apparatuses due to their wide viewing angles, high contrast, and high response speeds. Also, organic light emitting display apparatuses in which a light emitting layer is formed of an organic material have higher brightness, lower driving voltage, and higher response speed than inorganic light emitting display apparatuses, and display multicolored images.

Meanwhile, organic light emitting display apparatuses can be damaged by moisture. Accordingly, in order to protect organic light emitting devices from external moisture and dirt, the organic light emitting devices may be sealed. Glass frit is used to seal organic light emitting devices. However, forming the glass frit is a time-consuming process and it is difficult to form a correct pattern of the glass frit.

The discussion in this section is to provide general background information, and does not constitute an admission of prior art.

SUMMARY

One aspect of the invention provides a method of making an organic light emitting display apparatus, which comprises: providing a first substrate comprising a first surface; placing a mask over the first surface, wherein the mask comprises a patterned opening configured to pass a frit paste composition therethrough, wherein the patterned opening forms a closed loop, wherein the mask comprises a second surface facing away from the first surface of the first substrate; providing the frit paste composition on the second surface of the mask; and pressing the frit paste composition such that the frit paste composition passes through the patterned opening and lands on the first surface of the first substrate to form a structure of the frit paste composition in a closed loop on the first surface.

In the foregoing method, the structure of the frit paste composition may comprise a third surface substantially parallel to the first surface of the first substrate, and wherein the third surface is substantially flat. The structure of the frit paste composition may comprise a third surface substantially parallel to the first surface of the first substrate, and wherein the third surface may be free of a substantial bump or step. An organic light emitting display array may be formed on the first surface, wherein the structure of the frit paste composition may surround the organic light emitting display array. The method further comprising providing a second substrate comprising a fourth surface, providing an organic light emitting display array formed on the fourth surface, and arranging the first and second substrates such that the organic light emitting display array faces the first substrate and that the structure of frit paste composition contacts the fourth surface.

Still in the foregoing method, the mask may comprises a sheet of screen with a plurality of meshes and a material formed on the sheet of screen, and wherein the material is to selectively block the plurality of meshes of the sheet of screen so as to form the patterned opening in the mask. The screen may have about 200 to about 400 meshes per square inch. The method may further comprises heating the structure of the frit paste composition to form a solid frit integrated with the first substrate, wherein the solid frit comprises a fifth surface substantially parallel to the first surface of the first substrate, and wherein the fifth surface is substantially flat. The fifth surface may be substantially smooth. The fifth surface may be free of a substantial bump or step. The mask may be placed over the first surface with a gap between the mask and the first surface. Pressing may cause the frit paste composition to move into the gap.

Further in the foregoing method, the mask may comprise at least one additional patterned opening configured to pass the frit paste composition therethrough, wherein the at least one additional patterned opening forms a closed loop. Pressing comprises forming at least one additional structure of the frit paste composition on the first substrate a closed loop.

Another aspect of the invention provides an organic light emitting display apparatus produced by the foregoing method.

Yet anther aspect of the invention provides an apparatus for use in making an organic light emitting display apparatus, the apparatus comprising: a glass plate comprising a glass surface; and a frit integrated on the glass surface, wherein the frit forms a closed loop, wherein the frit comprises a top surface, a first side surface and a second side surface, wherein the top surface generally parallel to the glass surface and is not covered by another glass plate, wherein the top surface forms a closed loop and is free of a substantial bump or step.

In the foregoing aspect, the top surface may be substantially flat. The frit may have a height which is a distance between the glass surface and the top surface measured in a direction perpendicular to the glass surface, and wherein the height may be substantially the same throughout the closed loop. The top surface and the first side surface may form a first edge therebetween, and wherein the top surface and the second side surface may form a second edge therebetween. The frit may comprise a plurality of straight segments, and wherein the first edge is substantially straight in a first one of the plurality of straight segments. The frit may comprise a plurality of straight segments, and wherein the first edge and the second edge may be substantially parallel to each other in a first one of the plurality of straight segments.

Still in the foregoing apparatus, the frit may comprise a plurality of straight segments, wherein a first one of the plurality of straight segments may generally extends in a first direction parallel to the glass surface, wherein the frit comprises a first width which is a distance between the first edge and the second edge measured in a second direction perpendicular to the first direction and parallel to the glass surface, wherein the glass surface and the first side surface forms a third edge, wherein the glass surface and the second side surface form a fourth edge, wherein the frit has a second width which is a distance between the third edge and the fourth edge measured in the second direction, and wherein the first width may be about 0.5 to about 1 times of the second width.

An aspect of the present invention provides an organic light emitting display apparatus for easily sealing an organic light emitting device and a method of manufacturing the organic light emitting display apparatus.

An aspect of the present invention provides a method of manufacturing an organic light emitting display apparatus, the method comprising: preparing a substrate comprising a display unit comprising an organic light emitting device; preparing a sealing member facing a surface of the substrate; coating glass frit paste on a surface of the sealing member so that glass frit units are formed to correspond to an area surrounding the display unit; and combining the substrate and the sealing member using the glass frit units, wherein the glass frit units are formed using a screen printing method.

The method may further comprise sintering the coated glass frit paste to form the glass frit units. After the formation of the glass frit units, a ratio of the width of a bottom surface of the glass frit units facing the sealing member to the width of a top surface of the glass frit units is in the range of 0.5 to 0.95. After the formation of the glass frit units, the height of the glass frit units is in the range of 3 to 100 micrometers. After the formation of the glass frit units, an interval between the glass frit units and the display unit is in the range of 20 micrometers to 20 millimeters. The glass frit paste is coated on the sealing member using a screen mask, and the screen mask has 200 through 400 meshes. The combining of the substrate and the sealing member using the glass frit units comprises melting and curing the glass frit units. The melting of the glass frit units comprises irradiating a laser beam on the glass frit units. The method may further comprise: coating a sealant layer on the sealing member to surround the glass frit units on the sealing member.

An aspect of the present invention provides an organic light emitting display apparatus comprising: a substrate; a display unit formed on the substrate and comprising an organic light emitting device; a sealing member combined with the substrate so as to seal the organic light emitting device; and a glass frit unit interposed between the sealing member and the substrate so as to correspond to an area surrounding the display unit, wherein a ratio of the width of a bottom surface of the glass frit unit facing the sealing member to a width of a top surface of the glass frit unit is in the range of 0.5 to 1, and the height of the glass frit unit is in the range of 3 to 100 micrometers.

The organic light emitting display apparatus may further comprise a sealant layer interposed between the sealing member and the substrate, wherein the sealant layer is formed to surround the glass frit unit.

BRIEF DESCRIPTION OF THE DRAWINGS

The above and other features and advantages will become more apparent by describing in detail exemplary embodiments thereof with reference to the attached drawings in which.

DETAILED DESCRIPTION OF EMBODIMENTS

Various embodiments of the present invention will now be described with reference to the accompanying drawings. The invention may, however, be embodied in many different forms and should not be construed as being limited to the embodiments set forth herein.

An organic light emitting display (OLED) is a display device comprising an array of organic light emitting diodes. Organic light emitting diodes are solid state devices which include an organic material and are adapted to generate and emit light when appropriate electrical potentials are applied.

Figure 10A:
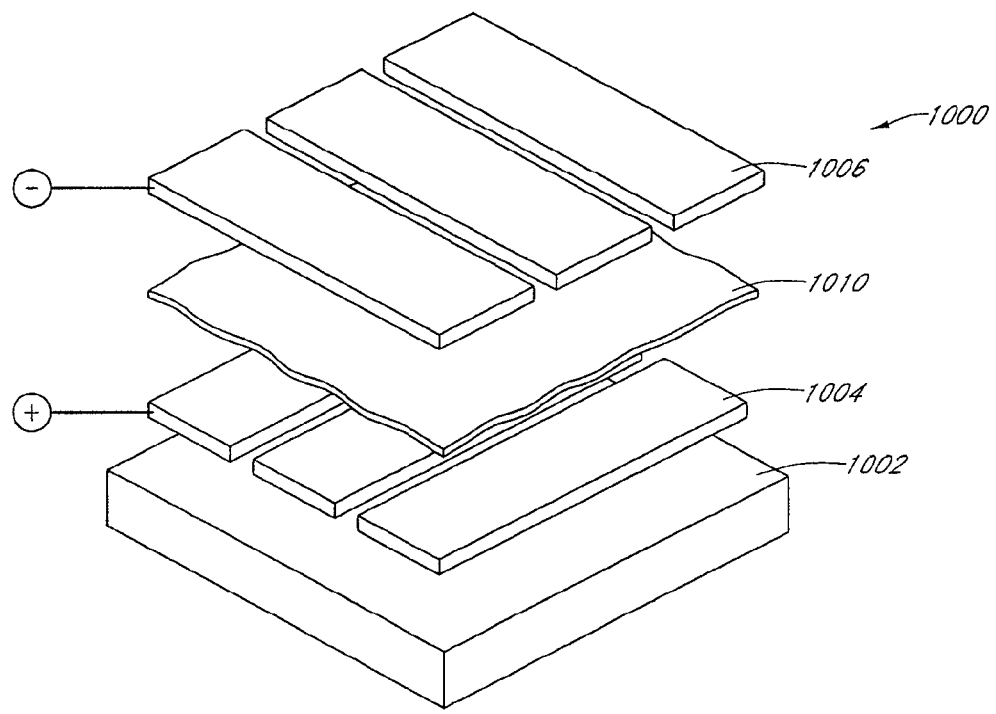
FIG. 10A is a schematic exploded view of a passive matrix type organic light emitting display device in accordance with one embodiment.
Figure 10B:
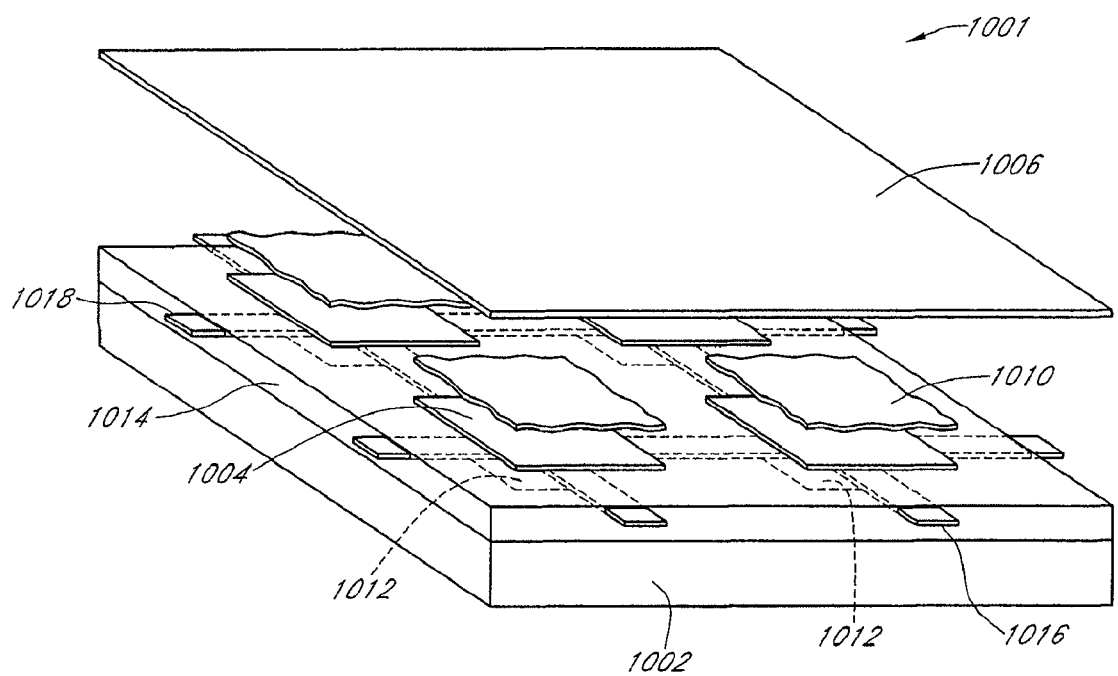
FIG. 10B is a schematic exploded view of an active matrix type organic light emitting display device in accordance with one embodiment.

OLEDs can be generally grouped into two basic types dependent on the arrangement with which the stimulating electrical current is provided. FIG. 10A schematically illustrates an exploded view of a simplified structure of a passive matrix type OLED 1000. FIG. 10B schematically illustrates a simplified structure of an active matrix type OLED 1001. In both configurations, the OLED 1000, 1001 includes OLED pixels built over a substrate 1002, and the OLED pixels include an anode 1004, a cathode 1006 and an organic layer 1010. When an appropriate electrical current is applied to the anode 1004, electric current flows through the pixels and visible light is emitted from the organic layer.

Referring to FIG. 10A, the passive matrix OLED (PMOLED) design includes elongate strips of anode 1004 arranged generally perpendicular to elongate strips of cathode 1006 with organic layers interposed therebetween. The intersections of the strips of cathode 1006 and anode 1004 define individual OLED pixels where light is generated and emitted upon appropriate excitation of the corresponding strips of anode 1004 and cathode 1006. PMOLEDs provide the advantage of relatively simple fabrication.

Referring to FIG. 10B, the active matrix OLED (AMOLED) includes local driving circuits 1012 arranged between the substrate 1002 and an array of OLED pixels. An individual pixel of AMOLEDs is defined between the common cathode 1006 and an anode 1004, which is electrically isolated from other anodes. Each driving circuit 1012 is coupled with an anode 1004 of the OLED pixels and further coupled with a data line 1016 and a scan line 1018. In embodiments, the scan lines 1018 supply scan signals that select rows of the driving circuits, and the data lines 1016 supply data signals for particular driving circuits. The data signals and scan signals stimulate the local driving circuits 1012, which excite the anodes 1004 so as to emit light from their corresponding pixels.

In the illustrated AMOLED, the local driving circuits 1012, the data lines 1016 and scan lines 1018 are buried in a planarization layer 1014, which is interposed between the pixel array and the substrate 1002. The planarization layer 1014 provides a planar top surface on which the organic light emitting pixel array is formed. The planarization layer 1014 may be formed of organic or inorganic materials, and formed of two or more layers although shown as a single layer. The local driving circuits 1012 are typically formed with thin film transistors (TFT) and arranged in a grid or array under the OLED pixel array. The local driving circuits 1012 may be at least partly made of organic materials, including organic TFT. AMOLEDs have the advantage of fast response time improving their desirability for use in displaying data signals. Also, AMOLEDs have the advantages of consuming less power than passive matrix OLEDs.

Referring to common features of the PMOLED and AMOLED designs, the substrate 1002 provides structural support for the OLED pixels and circuits. In various embodiments, the substrate 1002 can comprise rigid or flexible materials as well as opaque or transparent materials, such as plastic, glass, and/or foil. As noted above, each OLED pixel or diode is formed with the anode 1004, cathode 1006 and organic layer 1010 interposed therebetween. When an appropriate electrical current is applied to the anode 1004, the cathode 1006 injects electrons and the anode 1004 injects holes. In certain embodiments, the anode 1004 and cathode 1006 are inverted; i.e., the cathode is formed on the substrate 1002 and the anode is opposingly arranged.

Interposed between the cathode 1006 and anode 1004 are one or more organic layers. More specifically, at least one emissive or light emitting layer is interposed between the cathode 1006 and anode 1004. The light emitting layer may comprise one or more light emitting organic compounds. Typically, the light emitting layer is configured to emit visible light in a single color such as blue, green, red or white. In the illustrated embodiment, one organic layer 1010 is formed between the cathode 1006 and anode 1004 and acts as a light emitting layer. Additional layers, which can be formed between the anode 1004 and cathode 1006, can include a hole transporting layer, a hole injection layer, an electron transporting layer and an electron injection layer.

Hole transporting and/or injection layers can be interposed between the light emitting layer 1010 and the anode 1004. Electron transporting and/or injecting layers can be interposed between the cathode 1006 and the light emitting layer 1010. The electron injection layer facilitates injection of electrons from the cathode 1006 toward the light emitting layer 1010 by reducing the work function for injecting electrons from the cathode 1006. Similarly, the hole injection layer facilitates injection of holes from the anode 1004 toward the light emitting layer 1010. The hole and electron transporting layers facilitate movement of the carriers injected from the respective electrodes toward the light emitting layer.

In some embodiments, a single layer may serve both electron injection and transportation functions or both hole injection and transportation functions. In some embodiments, one or more of these layers are lacking. In some embodiments, one or more organic layers are doped with one or more materials that help injection and/or transportation of the carriers.

In embodiments where only one organic layer is formed between the cathode and anode, the organic layer may include not only an organic light emitting compound but also certain functional materials that help injection or transportation of carriers within that layer.

There are numerous organic materials that have been developed for use in these layers including the light emitting layer. Also, numerous other organic materials for use in these layers are being developed. In some embodiments, these organic materials may be macromolecules including oligomers and polymers. In some embodiments, the organic materials for these layers may be relatively small molecules. The skilled artisan will be able to select appropriate materials for each of these layers in view of the desired functions of the individual layers and the materials for the neighboring layers in particular designs.

In operation, an electrical circuit provides appropriate potential between the cathode 1006 and anode 1004. This results in an electrical current flowing from the anode 1004 to the cathode 1006 via the interposed organic layer(s). In one embodiment, the cathode 1006 provides electrons to the adjacent organic layer 1010. The anode 1004 injects holes to the organic layer 1010. The holes and electrons recombine in the organic layer 1010 and generate energy particles called "excitons." The excitons transfer their energy to the organic light emitting material in the organic layer 1010, and the energy is used to emit visible light from the organic light emitting material. The spectral characteristics of light generated and emitted by the OLED 1000, 1001 depend on the nature and composition of organic molecules in the organic layer(s). The composition of the one or more organic layers can be selected to suit the needs of a particular application by one of ordinary skill in the art.

OLED devices can also be categorized based on the direction of the light emission. In one type referred to as "top emission" type, OLED devices emit light and display images through the cathode or top electrode 1006. In these embodiments, the cathode 1006 is made of a material transparent or at least partially transparent with respect to visible light. In certain embodiments, to avoid losing any light that can pass through the anode or bottom electrode 1004, the anode may be made of a material substantially reflective of the visible light. A second type of OLED devices emits light through the anode or bottom electrode 1004 and is called "bottom emission" type. In the bottom emission type OLED devices, the anode 1004 is made of a material which is at least partially transparent with respect to visible light. Often, in bottom emission type OLED devices, the cathode 1006 is made of a material substantially reflective of the visible light. A third type of OLED devices emits light in two directions, e.g. through both anode 1004 and cathode 1006. Depending upon the direction(s) of the light emission, the substrate may be formed of a material which is transparent, opaque or reflective of visible light.

Figure 10C:
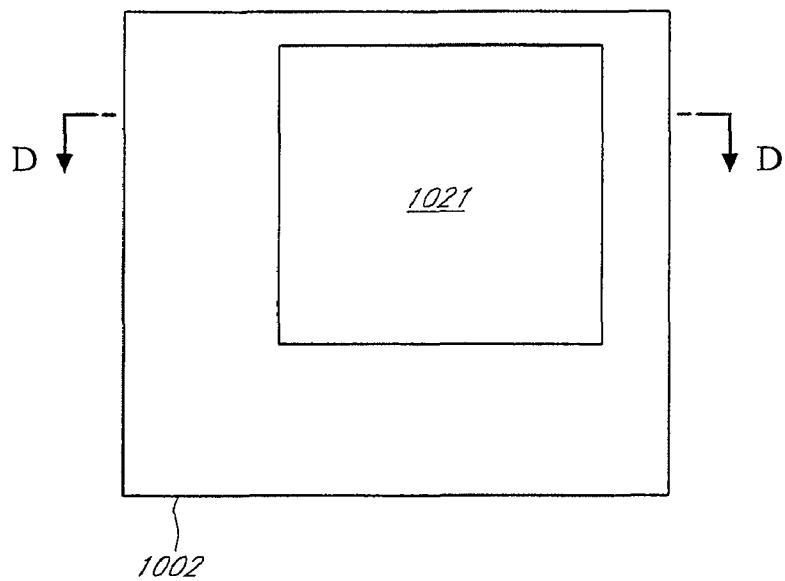
FIG. 10C is a schematic top plan view of an organic light emitting display in accordance with one embodiment.

In many embodiments, an OLED pixel array 1021 comprising a plurality of organic light emitting pixels is arranged over a substrate 1002 as shown in FIG. 10C. In embodiments, the pixels in the array 1021 are controlled to be turned on and off by a driving circuit (not shown), and the plurality of the pixels as a whole displays information or image on the array 1021. In certain embodiments, the OLED pixel array 1021 is arranged with respect to other components, such as drive and control electronics to define a display region and a non-display region. In these embodiments, the display region refers to the area of the substrate 1002 where OLED pixel array 1021 is formed. The non-display region refers to the remaining areas of the substrate 1002. In embodiments, the non-display region can contain logic and/or power supply circuitry. It will be understood that there will be at least portions of control/drive circuit elements arranged within the display region. For example, in PMOLEDs, conductive components will extend into the display region to provide appropriate potential to the anode and cathodes. In AMOLEDs, local driving circuits and data/scan lines coupled with the driving circuits will extend into the display region to drive and control the individual pixels of the AMOLEDs.

Figure 10D:
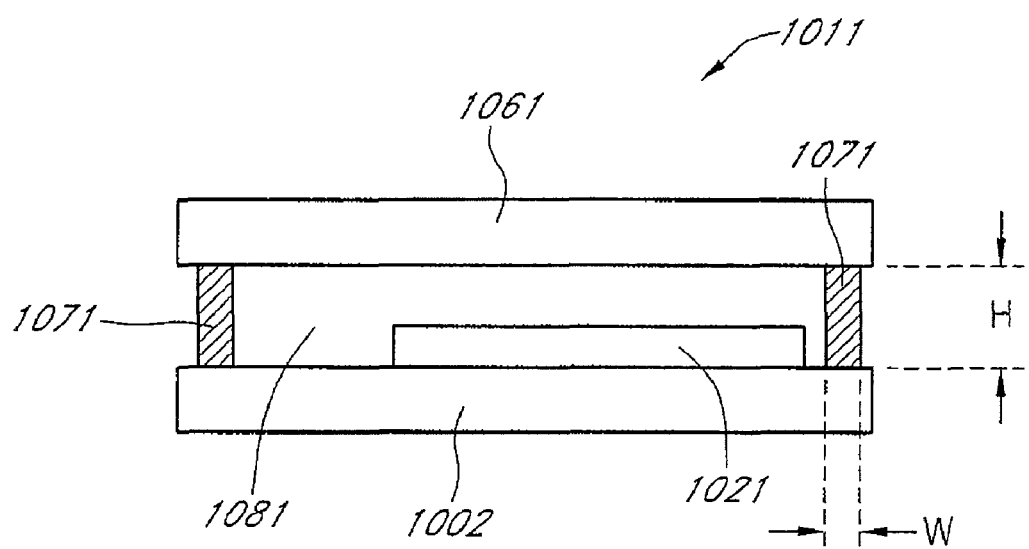
FIG. 10D is a cross-sectional view of the organic light emitting display of FIG. 10C, taken along the line d-d.

One design and fabrication consideration in OLED devices is that certain organic material layers of OLED devices can suffer damage or accelerated deterioration from exposure to water, oxygen or other harmful gases. Accordingly, it is generally understood that OLED devices be sealed or encapsulated to inhibit exposure to moisture and oxygen or other harmful gases found in a manufacturing or operational environment. FIG. 10D schematically illustrates a cross-section of an encapsulated OLED device 1011 having a layout of FIG. 10C and taken along the line d-d of FIG. 10C. In this embodiment, a generally planar top plate or substrate 1061 engages with a seal 1071 which further engages with a bottom plate or substrate 1002 to enclose or encapsulate the OLED pixel array 1021. In other embodiments, one or more layers are formed on the top plate 1061 or bottom plate 1002, and the seal 1071 is coupled with the bottom or top substrate 1002, 1061 via such a layer. In the illustrated embodiment, the seal 1071 extends along the periphery of the OLED pixel array 1021 or the bottom or top plate 1002, 1061.

In embodiments, the seal 1071 is made of a frit material as will be further discussed below. In various embodiments, the top and bottom plates 1061, 1002 comprise materials such as plastics, glass and/or metal foils which can provide a barrier to passage of oxygen and/or water to thereby protect the OLED pixel array 1021 from exposure to these substances. In embodiments, at least one of the top plate 1061 and the bottom plate 1002 are formed of a substantially transparent material.

To lengthen the life time of OLED devices 1011, it is generally desired that seal 1071 and the top and bottom plates 1061, 1002 provide a substantially non-permeable seal to oxygen and water vapor and provide a substantially hermetically enclosed space 1081. In certain applications, it is indicated that the seal 1071 of a frit material in combination with the top and bottom plates 1061, 1002 provide a barrier to oxygen of less than approximately $10^{-3}$ cc/m$^2$-day and to water of less than $10^{-6}$ g/m$^2$-day. Given that some oxygen and moisture can permeate into the enclosed space 1081, in some embodiments, a material that can take up oxygen and/or moisture is formed within the enclosed space 1081.

The seal 1071 has a width W, which is its thickness in a direction parallel to a surface of the top or bottom substrate 1061, 1002 as shown in FIG. 10D. The width varies among embodiments and ranges from about 300 μm to about 3000 μm, optionally from about 500 μm to about 1500 μm. Also, the width may vary at different positions of the seal 1071. In some embodiments, the width of the seal 1071 may be the largest where the seal 1071 contacts one of the bottom and top substrate 1002, 1061 or a layer formed thereon. The width may be the smallest where the seal 1071 contacts the other. The width variation in a single cross-section of the seal 1071 relates to the cross-sectional shape of the seal 1071 and other design parameters.

The seal 1071 has a height H, which is its thickness in a direction perpendicular to a surface of the top or bottom substrate 1061, 1002 as shown in FIG. 10D. The height varies among embodiments and ranges from about 2 μm to about 30 μm, optionally from about 10 μm to about 15 μm. Generally, the height does not significantly vary at different positions of the seal 1071. However, in certain embodiments, the height of the seal 1071 may vary at different positions thereof.

In the illustrated embodiment, the seal 1071 has a generally rectangular cross-section. In other embodiments, however, the seal 1071 can have other various cross-sectional shapes such as a generally square cross-section, a generally trapezoidal cross-section, a cross-section with one or more rounded edges, or other configuration as indicated by the needs of a given application. To improve hermeticity, it is generally desired to increase the interfacial area where the seal 1071 directly contacts the bottom or top substrate 1002, 1061 or a layer formed thereon. In some embodiments, the shape of the seal can be designed such that the interfacial area can be increased.

The seal 1071 can be arranged immediately adjacent the OLED array 1021, and in other embodiments, the seal 1071 is spaced some distance from the OLED array 1021. In certain embodiment, the seal 1071 comprises generally linear segments that are connected together to surround the OLED array 1021. Such linear segments of the seal 1071 can extend, in certain embodiments, generally parallel to respective boundaries of the OLED array 1021. In other embodiment, one or more of the linear segments of the seal 1071 are arranged in a non-parallel relationship with respective boundaries of the OLED array 1021. In yet other embodiments, at least part of the seal 1071 extends between the top plate 1061 and bottom plate 1002 in a curvilinear manner.

As noted above, in certain embodiments, the seal 1071 is formed using a frit material or simply "frit" or glass frit," which includes fine glass particles. The frit particles includes one or more of magnesium oxide (MgO), calcium oxide (CaO), barium oxide (BaO), lithium oxide (Li$_2$O), sodium oxide (Na$_2$O), potassium oxide (K$_2$O), boron oxide (B$_2$O$_3$), vanadium oxide (V$_2$O$_5$), zinc oxide (ZnO), tellurium oxide (TeO$_2$), aluminum oxide (Al$_2$O$_3$), silicon dioxide (SiO$_2$), lead oxide (PbO), tin oxide (SnO), phosphorous oxide (P$_2$O$_5$), ruthenium oxide (Ru$_2$O), rubidium oxide (Rb$_2$O), rhodium oxide (Rh$_2$O), ferrite oxide (Fe$_2$O$_3$), copper oxide (CuO), titanium oxide (TiO$_2$), tungsten oxide (WO$_3$), bismuth oxide (Bi$_2$O$_3$), antimony oxide (Sb$_2$O$_3$), lead-borate glass, tin-phosphate glass, vanadate glass, and borosilicate, etc. In embodiments, these particles range in size from about 2 μm to about 30 μm, optionally about 5 μm to about 10 μm, although not limited only thereto. The particles can be as large as about the distance between the top and bottom substrates 1061, 1002 or any layers formed on these substrates where the frit seal 1071 contacts.

The frit material used to form the seal 1071 can also include one or more filler or additive materials. The filler or additive materials can be provided to adjust an overall thermal expansion characteristic of the seal 1071 and/or to adjust the absorption characteristics of the seal 1071 for selected frequencies of incident radiant energy. The filler or additive material(s) can also include inversion and/or additive fillers to adjust a coefficient of thermal expansion of the frit. For example, the filler or additive materials can include transition metals, such as chromium (Cr), iron (Fe), manganese (Mn), cobalt (Co), copper (Cu), and/or vanadium. Additional materials for the filler or additives include ZnSiO$_4$, PbTiO$_3$, ZrO$_2$, eucryptite.

In embodiments, a frit material as a dry composition contains glass particles from about 20 to 90 about wt %, and the remaining includes fillers and/or additives. In some embodiments, the frit paste contains about 10-30 wt % organic materials and about 70-90% inorganic materials. In some embodiments, the frit paste contains about 20 wt % organic materials and about 80 wt % inorganic materials. In some embodiments, the organic materials may include about 0-30 wt % binder(s) and about 70-100 wt % solvent(s). In some embodiments, about 10 wt % is binder(s) and about 90 wt % is solvent(s) among the organic materials. In some embodiments, the inorganic materials may include about 0-10 wt % additives, about 20-40 wt % fillers and about 50-80 wt % glass powder. In some embodiments, about 0-5 wt % is additive(s), about 25-30 wt % is filler(s) and about 65-75 wt % is the glass powder among the inorganic materials.

In forming a frit seal, a liquid material is added to the dry frit material to form a frit paste. Any organic or inorganic solvent with or without additives can be used as the liquid material. In embodiments, the solvent includes one or more organic compounds. For example, applicable organic compounds are ethyl cellulose, nitro cellulose, hydroxylpropyl cellulose, butyl carbitol acetate, terpineol, butyl cellusolve, acrylate compounds. Then, the thus formed frit paste can be applied to form a shape of the seal 1071 on the top and/or bottom plate 1061, 1002.

In one exemplary embodiment, a shape of the seal 1071 is initially formed from the frit paste and interposed between the top plate 1061 and the bottom plate 1002. The seal 1071 can in certain embodiments be pre-cured or pre-sintered to one of the top plate and bottom plate 1061, 1002. Following assembly of the top plate 1061 and the bottom plate 1002 with the seal 1071 interposed therebetween, portions of the seal 1071 are selectively heated such that the frit material forming the seal 1071 at least partially melts. The seal 1071 is then allowed to resolidify to form a secure joint between the top plate 1061 and the bottom plate 1002 to thereby inhibit exposure of the enclosed OLED pixel array 1021 to oxygen or water.

In embodiments, the selective heating of the frit seal is carried out by irradiation of light, such as a laser or directed infrared lamp. As previously noted, the frit material forming the seal 1071 can be combined with one or more additives or filler such as species selected for improved absorption of the irradiated light to facilitate heating and melting of the frit material to form the seal 1071.

Figure 10E:
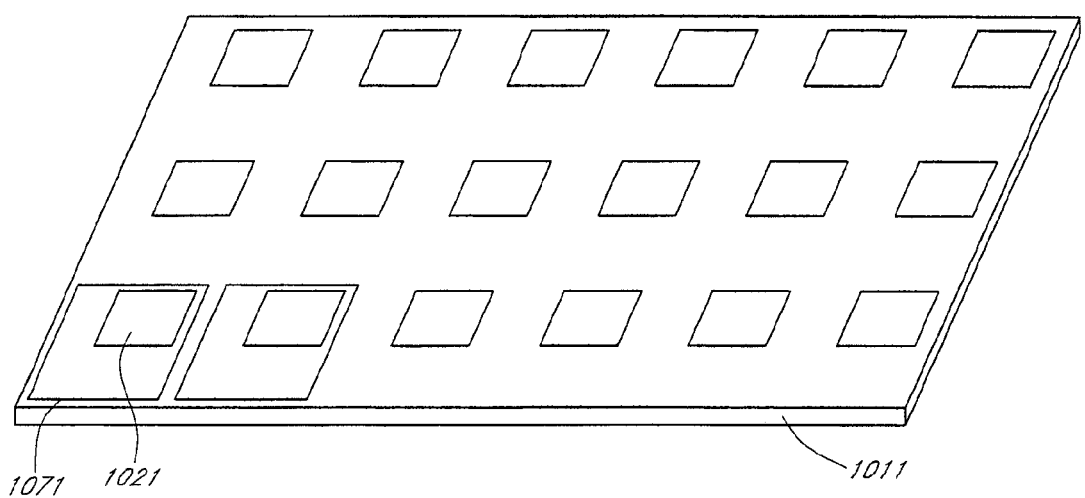
FIG. 10E is a schematic perspective view illustrating mass production of organic light emitting devices in accordance with one embodiment.

In some embodiments, OLED devices 1011 are mass produced. In an embodiment illustrated in FIG. 10E, a plurality of separate OLED arrays 1021 is formed on a common bottom substrate 1101. In the illustrated embodiment, each OLED array 1021 is surrounded by a shaped frit to form the seal 1071. In embodiments, common top substrate (not shown) is placed over the common bottom substrate 1101 and the structures formed thereon such that the OLED arrays 1021 and the shaped frit paste are interposed between the common bottom substrate 1101 and the common top substrate. The OLED arrays 1021 are encapsulated and sealed, such as via the previously described enclosure process for a single OLED display device. The resulting product includes a plurality of OLED devices kept together by the common bottom and top substrates. Then, the resulting product is cut into a plurality of pieces, each of which constitutes an OLED device 1011 of FIG. 10D. In certain embodiments, the individual OLED devices 1011 then further undergo additional packaging operations to further improve the sealing formed by the frit seal 1071 and the top and bottom substrates 1061, 1002.

Figure 1:
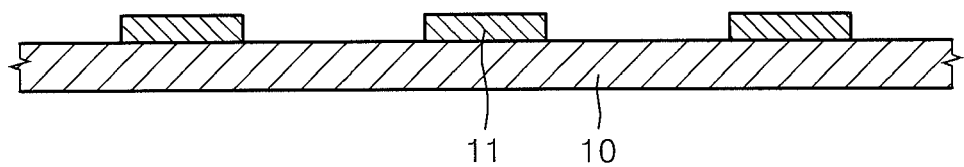
FIGS. 1 to 3 are views illustrating a method of manufacturing an organic light emitting display apparatus according to an embodiment of the present invention.
Figure 2:
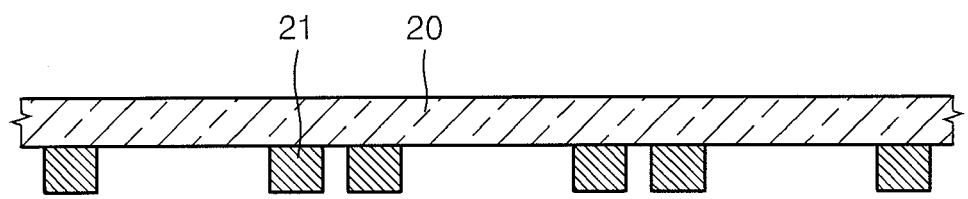
Figure 3:
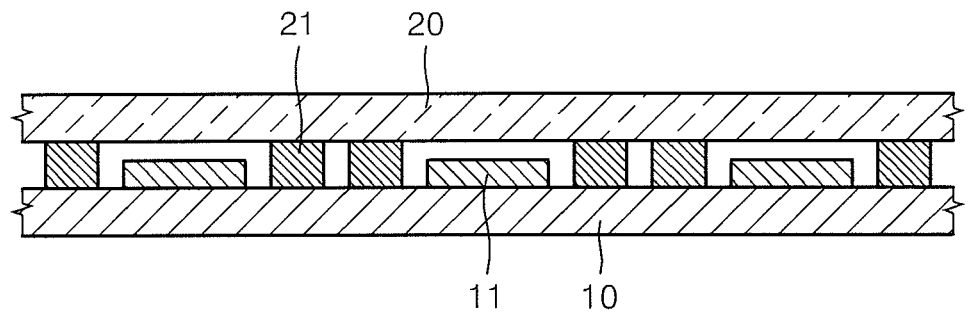

FIGS. 1 to 3 are views illustrating a method of manufacturing an organic light emitting display apparatus, according to an embodiment of the present invention. Referring to FIG. 1, a plurality of display units or arrays 11 are formed on a surface of a substrate 10, which is equivalent to the bottom substrate 1002 or 1011. In one embodiment, the substrate 10 may be formed of a transparent glass material which mainly includes $SiO_2$. Although not illustrated in FIG. 1, a buffer layer (not shown) may be further formed on the substrate 10 in order to smoothen the substrate 10 and prevent fluorine atoms from infiltrating into the substrate 10, and the buffer layer may be formed of at least one of $SiO_2$, $SiN_x$ and the like. The substrate 10 is not limited to a transparent glass material. That is, the substrate 10 may be formed of a transparent plastic material, a metal foil, or the like. In one embodiment, the substrate 10 may have multi layered configuration. Each of the display units 11 includes an organic light emitting device or array of pixels displaying an image. The organic light emitting device may be an active matrix (AM) organic light emitting device or a passive matrix (PM) organic light emitting device, and will be described later.

Referring to FIG. 2, a sealing member 20, which is equivalent to the top substrate 1061 is disposed so as to face one surface of the substrate 10. A plurality of glass frit units 21 are formed on the sealing member 20 so as to correspond to an area surrounding the display units 11 of the substrate 10, respectively. A function of the sealing member 20 is to protect the organic light emitting devices from external moisture and air or the like, and is formed of a transparent material. To achieve this, the sealing member 20 may be formed of glass or plastic, or may have a multi-layer structure including a plurality of layers of organic and inorganic compounds. The glass frit units 21 are formed on the sealing member 20. Then, the sealing member 20 is combined with the substrate 10 as illustrated in FIG. 3.

Figure 4:
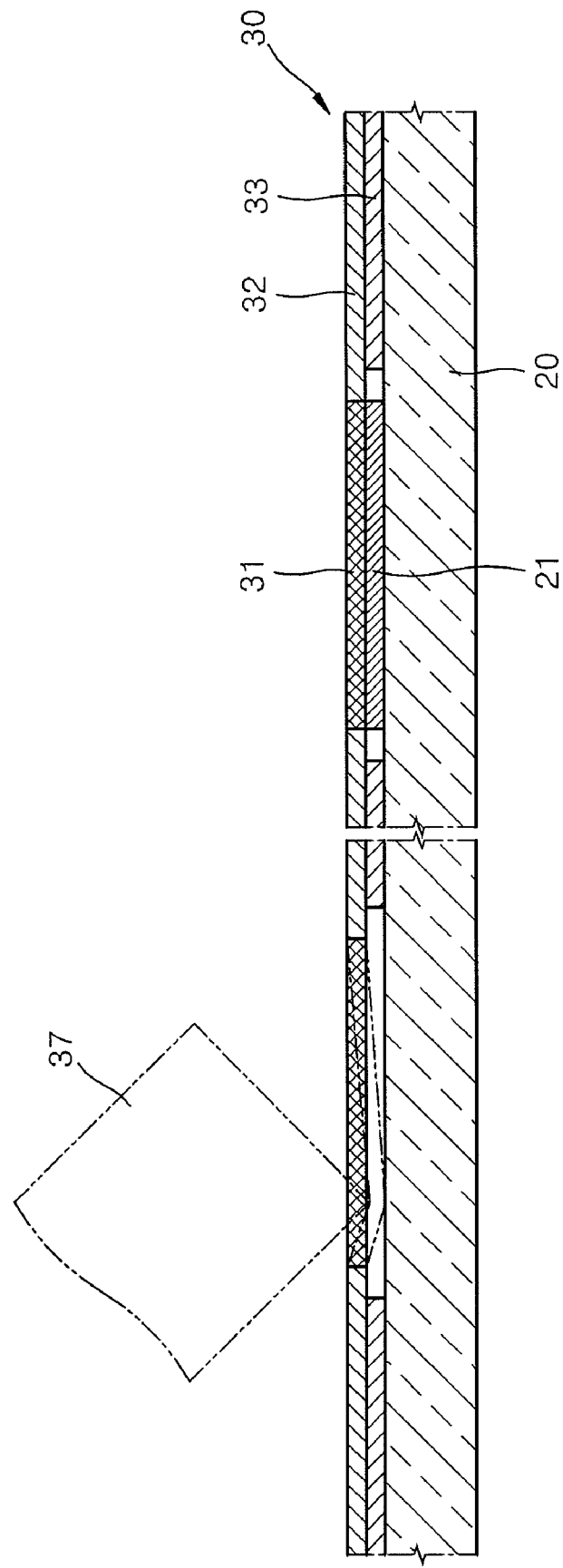
FIG. 4 is a schematic cross-sectional view for explaining an operation of forming glass frit units illustrated in FIG. 2 on a sealing member using a screen printing method according to an embodiment of the present invention.

A method of forming the glass frit units 21 on the sealing member 20 will be described in detail. FIG. 4 is a schematic cross-sectional view for explaining an operation of forming the glass frit units 21 illustrated in FIG. 2 on the sealing member 20 using a screen printing method according to an embodiment of the present invention. According to the illustrated embodiment of the present invention, the glass frit units 21 are formed on the sealing member 20 using a screen printing method. When a screen printing method is used, a screen mask 30 is required to form a layer having a desired pattern. Referring to FIG. 4, the screen mask 30 includes a screen unit or opening 31 through which glass frit paste for forming the glass frit units 21 infiltrates or is transmitted, and a shield unit 32 defining the screen unit 31 and blocking the glass frit paste from being transmitted. The screen mask 30 is formed of a mesh type material such as nylon fabric so that glass frit paste having a predetermined granularity may infiltrate the screen mask 30. The shield unit 32 is formed on portions of the screen mask 30 except where the screen unit 31 is formed by closing holes of the mesh type material using a hardener to form the shield unit 32 and define a pattern of the screen unit 31 corresponding to the shield unit 32. The screen mask 30 may be formed of polyester or stainless steel. Various meshes may be used in the screen mask 30. However, the screen mask 30 may have 200 through 400 meshes per square inch for the sealing property of the glass frit units 21 according to the granularity and viscosity of the glass frit paste.

Referring to FIG. 4, a supporting member 33 is attached to a bottom surface of the screen mask 30, for example, a bottom of a region corresponding to the shield unit 32. The supporting member 33 may be formed of an emulsion such as a resin, but is not limited thereto. However, other elements may be used to support the screen mask. As illustrated in FIG. 4, the supporting member 33 may be slightly separated from the screen unit 31. The glass frit paste is coated or put on the screen mask 30. A squeegee 37 is used to push the glass frit paste through the meshes of the screen unit 31 to form the glass frit units 21 in a predetermined pattern layer.

In order to manufacture a plurality of organic light emitting display apparatuses using the one substrate 10, a plurality of display units 11 independent from each other are formed on the one substrate 10. In addition, the screen mask 30 includes a plurality of screen units 31 so that the glass frit units 21 may be formed to correspond to the area surrounding the display units 11, respectively. The screen mask 30 is closely adhered to the sealing member 20, and then a screen printing method is performed. At this time, when the pressure between each of the screen units 31 and the sealing member 20 is the same, a regular coating can be realized. The glass frit units 21 are screen-printed, and then the glass frit units 21 may be cured using a predetermined sintering process.

Figure 5:
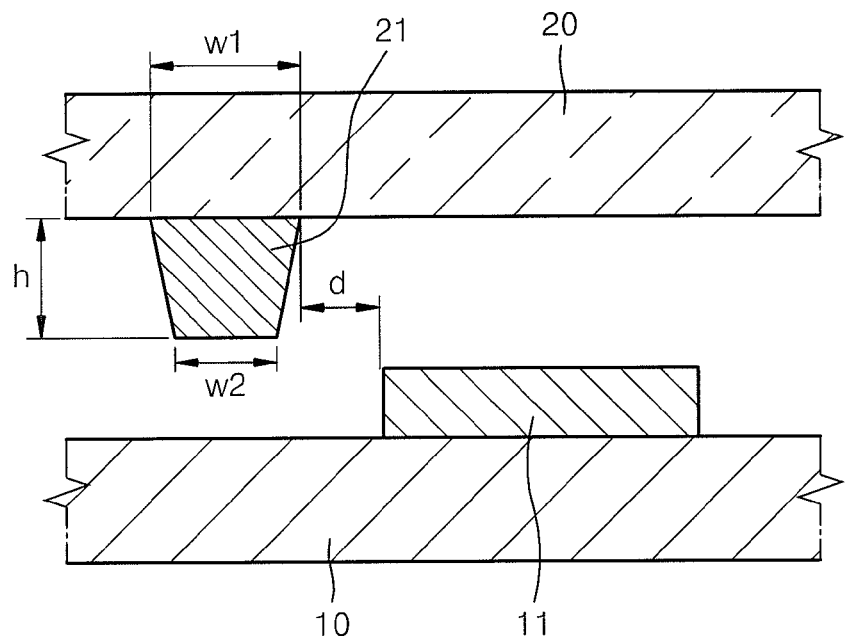
FIG. 5 is a cross-sectional view illustrating the detailed arrangement and structure of a glass frit unit according to an embodiment of the present invention.

FIG. 5 is a cross-sectional view illustrating the detailed arrangement and structure of one of the glass frit units 21, according to an embodiment of the present invention. Referring to FIG. 5, the glass frit units 21 may be formed on the sealing member 20 such that the widths of top and bottom surfaces of each of the glass frit units 21 may be different from each other. That is, as illustrated in FIG. 5, the width w1 of a bottom surface of each of the glass frit units 21 facing the sealing member 20 is greater than the width w2 of a top surface of each of the glass frit units 21. In one embodiment, w2/w1 may be in the range of about 0.5 to about 0.95. Since the contact area between the glass frit units 21 and the substrate 10 is reduced when w2/w1 may be small. In some embodiments, the ratio of W2 with respect to W1 of the glass frit structure, which is not pre-sintered or is pre-sintered, is about 0.4, 0.5, 0.6, 0.65, 0.7, 0.73, 0.75, 0.78, 0.8, 0.83, 0.85, 0.88, 0.9, 0.92, 0.95, 0.97, 0.99 or 1.0. In certain embodiments, the ratio of W2 with respect to W1 is within a range defined by two of foregoing ratios.

In an exemplary method of forming glass frit paste by way of dispensing the glass frit paste from a nozzle, the glass frit paste discharged from a nozzle of a dispenser and applied on a substrate may have top surface which is narrow, round and irregular. As a result, the w2/w1 value of the glass frit units 21 may be small after the sintering process.

However, in the above discussed embodiments, when the glass frit units 21 are formed using a screen printing method, the screen mask 30 is used. An upper surface of the glass frit paste is pressed by the squeegee 37 so that the glass frit paste is pushed into the screen units 31. The upper surface or portion of the glass frit paste is pressed by the squeegee 37, when the glass frit units 21 are formed on the sealing member 20. Thus, the top surfaces of the glass frit units 21, which do not contact the sealing member 20, are smooth and the width ratio between the top and bottom surfaces, that is w2/w1, can be equal to about 1, in one embodiment. In particular, when using the screen printing method, a w2/w1 value of about 0.7 or more can be easily obtained without an additional operation.

In the illustrated embodiments, the width w1 of the frit structure is substantially uniform throughout the frit. In one embodiment, the variation of the width w1 may be smaller than about 10% of the greatest value of the width w1. In certain embodiments, the variation of the width w1 may be about 15, 10, 8, 6, 5, 4, 3, 2 or 1% of the greatest value of the width w1 of the frit structure. In some embodiments, the variation of the width w1 may be within a range between two of the foregoing variations of the width w1. Similarly, in the illustrated embodiments, the width w2 of the frit structure is substantially uniform throughout the frit. In one embodiment, the variation of the width w2 may be smaller than about 10% of the greatest value of the width w2. In certain embodiments, the variation of the width w2 may be about 15, 10, 8, 6, 5, 4, 3, 2 or 1% of the greatest value of the width w2 of the frit structure. In some embodiments, the variation of the width w2 may be within a range between two of the foregoing variations of the width w2.

In the illustrated embodiments, the height h of the frit structure is substantially uniform throughout the frit. In one embodiment, the variation of the height h may be smaller than about 20% of the greatest value of the height h. In certain embodiments, the variation of the height h may be about 25, 20, 15, 10, 8, 6, 5, 4, 3, 2 or 1% of the greatest value of the height h of the frit structure. In some embodiments, the variation of the height h may be within a range between two of the foregoing variations of the height h.

The height h of the glass frit units 21 may be within a range of about 3 to about 100 micrometers. The height h of the glass frit units 21 may be about 3 micrometers or more so as to maintain the height of the display units 11. A distance d between each of the glass frit units 21 and each of the display units 11 may be about 20 micrometers or more. The distance d may be appropriately determined according to manufacturing conditions and the size of an organic emitting light display apparatus to be manufactured. Thus, the distance d may be preferably about 20 millimeters or less.

Figure 6:
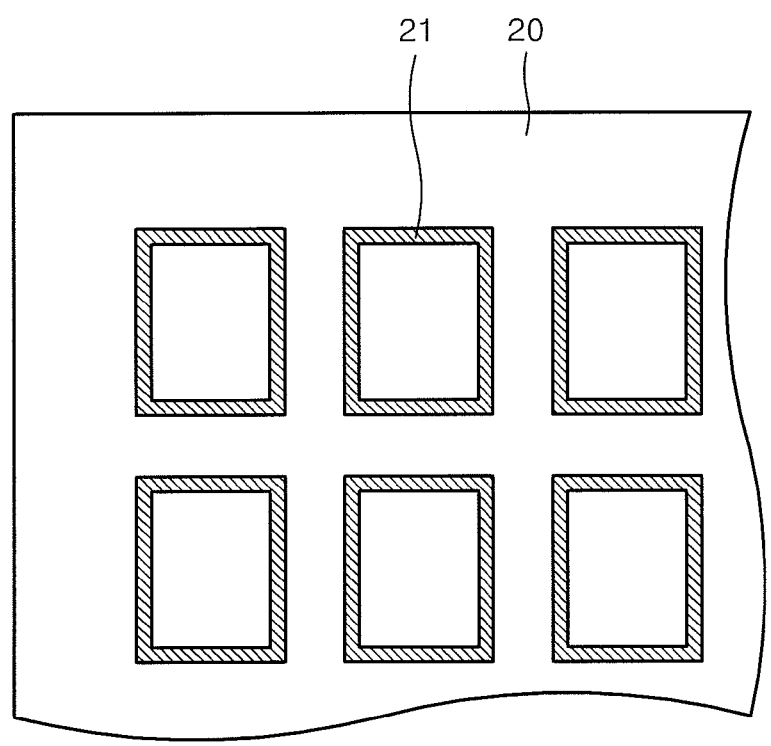
FIG. 6 is a plan view for explaining the operation in which the glass frit units of FIG. 2 are coated on the sealing member of FIG. 2, according to an embodiment of the present invention.

FIG. 6 is a plan view for explaining the operation in which the glass frit units 21 of FIG. 2 are coated on the sealing member 20 of FIG. 2, according to an embodiment of the present invention. As described above, the glass frit units 21 are formed so as to correspond to an area surrounding the display units 11, respectively.

The glass frit units 21 are formed on the sealing member 20, and then the sealing member 20 is combined with the substrate 10. First, the sealing member 20 is disposed on the substrate 10. At this time, the glass frit units 21 are correctly aligned so as to correspond to the area surrounding the display units 11 formed on the substrate 10. After correctly aligning the glass frit units 21, an operation of melting the glass frit units 21 is performed. The glass frit units 21 may be melted using various methods. However, the glass frit units 21 may be melted using a laser in order to prevent the display units 11 from being thermally damaged. When the melted glass frit units 21 are cooled, the substrate 10 and the sealing member 20 are combined with each other by the glass frit units 21. In particular, when the glass frit units 21 are melted using a laser, a laser beam is irradiated on the top surfaces of the glass frit units 21 which do not contact the sealing member 20. In some embodiments, the top surfaces of the glass frit units 21 are melted, and then the width w2 of the top surfaces can be greater than that after the sintering process. Thus, the w2/w1 value of the glass frit units 21 before the above melting and resolidifying or pre-sintering process is in the range of about 0.5 to about 0.95, but the w2/w1 value of the glass frit units 21 after the melting and resolidifying process may be in the range of about 0.5 to about 1.

In an example of glass frit structure by using a dispensing method with a nozzle, when the glass frit units are formed using the dispensing method, the width of a frit coating may be irregular due to the technical limitation of a dispenser. Further, the width of each of the glass frit units increases and decreases at starting and finishing points, respectively, at which an operation of coating the glass frit units is started and finished, respectively. As a result, since stress may be concentrated on a part on which the width of the frit coating surface is not regular when a laser beam is irradiated, sealing may be damaged. However, as described above, in the above discussed embodiments, the width of the glass frit units 21 is regular as illustrated in FIG. 6 when the glass frit units 21 are formed using the screen printing method, the glass frit units 21 may have improved reliability, and thus the organic light emitting display apparatus may have improved sealing ability.

The sealing member 20 is combined with the substrate 10. Then, a plurality of organic light emitting display apparatuses can be manufactured by cutting along lines of the glass frit units 21 formed around each of the display units 11.

Figure 7:
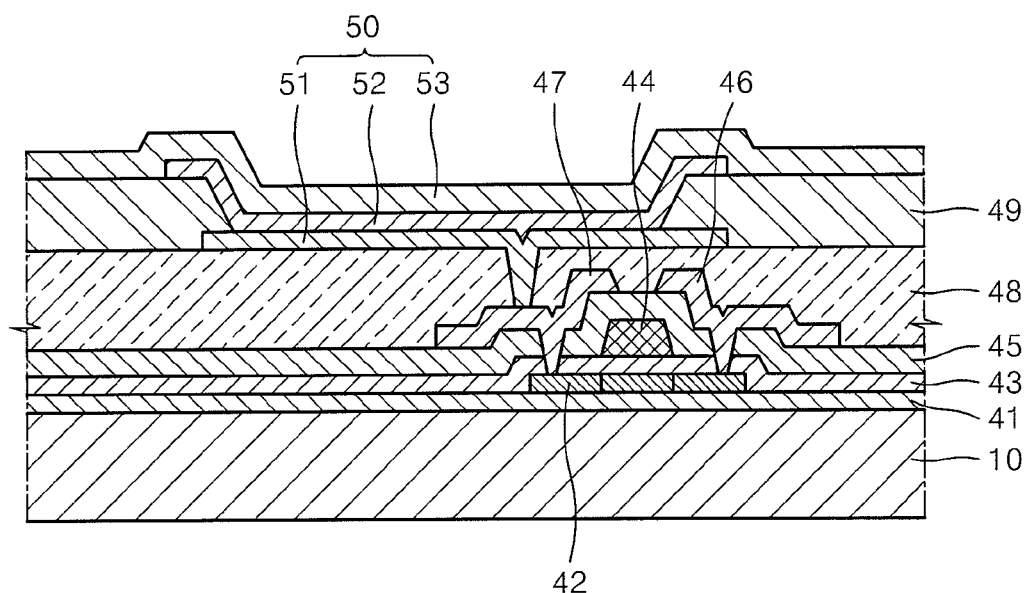
FIG. 7 is a partial schematic cross-sectional view illustrating a display unit of FIG. 1, according to an embodiment of the present invention.

A method of manufacturing an organic light emitting display apparatus according to an embodiment of the present invention may be used to manufacture different types of organic light emitting display apparatuses. FIG. 7 is a partial schematic cross-sectional view illustrating one of the display units 11 of FIG. 1, that is, a partial schematic cross-sectional view illustrating a top gate type active matrix (AM) organic light emitting display apparatus including an AM organic light emitting device 50, according to an embodiment of the present invention.

A buffer layer 41 may be formed on a substrate 10 in order to smoothen the substrate 10 and prevent fluorine atoms from infiltrating into the substrate 10. The buffer layer 41 may be formed of at least one of $SiO_2$, SiNx, and the like. A thin film transistor (TFT) is formed on the substrate 10. At least one TFT is formed in each pixel of the organic light emitting display apparatus, and is electrically connected to the AM organic light emitting device 50. In particular, a semiconductor layer 42 having a predetermined pattern is formed on the buffer layer 41. The semiconductor layer 42 may be formed of an inorganic or organic semiconductor material such as amorphous silicon or polysilicon, and includes a source region, a drain region and a channel region.

A gate insulating layer 43 formed of $SiO_2$, SiNx or the like is formed on the semiconductor layer 42. A gate electrode 44 is formed on a predetermined region of the gate insulating layer 43. The gate electrode 44 is formed of MoW, Al/Cu or the like, but is not limited thereto. That is, the gate electrode 44 may be formed of various materials according to adhesion with adjacent layers, a surface flatness of a stacked layer, electrical resistance, plasticity or the like. The gate electrode 44 is connected to a gate line (not shown) applying TFT on/off signals.

An inter-layer insulating layer 45 is formed on the gate electrode 44 so that a source electrode 46 and a drain electrode 47 may contact the source region and the drain region of the semiconductor layer 42, respectively. A passivation layer 48 covers and protects the TFT. The passivation layer 48 may comprise at least one of an inorganic insulating layer and an organic insulating layer. The inorganic insulating layer may be formed of $SiO_2$, SiNx, SiON, $Al_2O_3$, $TiO_2$, $Ta_2O_5$, $HfO_2$, $ZrO_2$, BST, PZT or the like. The organic insulating layer may be formed of a general-purpose polymer (PMMA, PS), polymer derivatives including a phenol group, an acryl based polymer, an imide based polymer, an allyl ether based polymer, an amide based polymer, a fluorine based polymer, a p-xylene based polymer, a vinyl alcohol based polymer, a blend thereof, or the like.

A first electrode 51 functioning as an anode of the AM organic light emitting device 50 is formed on the passivation layer 48. A pixel-defining layer 49 is formed of an insulating material so as to cover the resulting structure. An opening is formed in the pixel-defining layer 49, and then an organic emissive layer 52 of the AM organic light emitting device 50 is formed in a region defined by the opening. A second electrode 53 functioning as a cathode of the AM organic light emitting device 50 is formed so as to cover all pixels of the organic light emitting display apparatus. The polarities of the first electrode 51 and the second electrode 53 may be opposite to each other.

The AM organic light emitting device 50 which displays images by emitting light according to current flow includes the first electrode 51, the organic emissive layer 52 and the second electrode 53 which are electrically connected to the drain electrode 47 of the TFT through a contact hole. The first electrode 51 may be formed to correspond to a pixel using a photolithographic method. When the second electrode 53 is formed on the first electrode 51, the second electrode 53 is connected to an external terminal (not shown) to function as a cathode. The second electrode 53 may be formed on an entire active area displaying an image. The polarities of the first electrode 51 and the second electrode 53 may be opposite to each other. In the case of a bottom emission type organic light emitting display apparatus projecting an image towards the substrate 10, the first electrode 51 may be a transparent electrode and the second electrode 53 may be a reflective electrode. The first electrode 51 may be formed of ITO, IZO, ZnO, $In_2O_3$ or the like having a high work function, and the second electrode 53 may be formed of a metal having a low work function, that is, Ag, Mg, Al, Pt, Pd, Au, Ni, Nd, Ir, Cr, Li, Ca or the like.

In the case of a top emission type organic light emitting display apparatus projecting an image towards the second electrode 53, the first electrode 51 may be a reflective electrode, and the second electrode 53 may be a transparent electrode. At this time, the first electrode 51, which is the reflective electrode, is formed as follows. A reflective layer is formed of Ag, Mg, Al, Pt, Pd, Au, Ni, Nd, Ir, Cr, Li, Ca, compounds thereof, or the like, and then ITO, IZO, ZnO, $In_2O_3$ or the like having a high work function is formed on the resulting structure. In addition, the second electrode 53, which is the transparent electrode, is formed as follows. A metal having a low work function, that is, Ag, Mg, Al, Pt, Pd, Au, Ni, Nd, Ir, Cr, Li, Ca or a compound thereof is deposited, and an auxiliary electrode layer or a bus electrode line formed of a transparent conductive material such as ITO, IZO, ZnO, $In_2O_3$ or the like may be formed on the resulting structure. In a dual emission type organic light emitting display apparatus, both of the first electrode 51 and the second electrode 53 may be transparent electrodes.

The organic emissive layer 52 interposed between the first electrode 51 and the second electrode 53 emits light by electrical driving of the first electrode 51 and the second electrode 53. The organic emissive layer 52 may be formed of a small molecular weight organic material or a polymer organic material. When the organic emissive layer 52 is formed of the small molecular weight organic material, the organic emissive layer 52 may include a hole transport layer (HTL) and a hole injection layer (HIL) which are sequentially stacked in a direction towards the first electrode 51, and the organic emissive layer 52 may include an electron transport layer (ETL) and an electron injection layer (EIL) which are sequentially stacked in a direction towards the second electrode 53. In addition, various additional layers may be formed if necessary. An organic material used in the organic emissive layer 52 may be copper phthalocyanine (CuPc), N,N'-Di(naphthalene-1-yl)-N,N'-diphenyl-benzidine (NPB), tris-8-hydroxyquinoline aluminum (Alq3) or the like.

When the organic emissive layer 52 is formed of the polymer organic material, the organic emissive layer 52 may include only the HTL formed in the direction towards the first electrode 51. The polymer HTL may be formed of poly-(2,4)-ethylene-dihydroxy thiophene (PEDOT), polyaniline (PANI), or the like, and may be formed on the first electrode 51 using an ink jet printing method or a spin coating method. The polymer organic emissive layer 52 may be formed of PPV, Soluble PPV's, Cyano-PPV, Polyfluorene, or the like. A color pattern may be formed using a general method such as an ink jet printing, spin coating, heat transfer with a laser, or the like.

Although a top gate type AM organic light emitting display apparatus illustrated in FIG. 7 has been described, the present invention is not limited thereto. That is, various types of organic light emitting display apparatuses can be applied to embodiments of the present invention.

In some embodiment, since the glass frit units 21 are coated using the screen printing method when the organic light emitting display apparatus is manufactured using the method according to the above discussed embodiment of the present invention, manufacturing time can be reduced compared to the dispensing method or the like. When using the screen printing method, the glass frit units 21 can be easily patterned and the sectional shapes of the glass frit units 21 can be regular. The organic light emitting device can be easily protected from external moisture and air or the like due to good sealing characteristics of the glass frit units 21.

In an embodiment, glass frit units 21 are coated on a sealing member 20 using a screen mask 30 having 325 meshes, and the resulting structure is sintered for ten minutes at a temperature of about 420° C. The sealing member 20 is aligned with a substrate 10 including display units 11 formed thereon, and then the substrate 10 and the sealing member 20 are combined by irradiating a laser beam. In an embodiment, since the glass frit units 21 are formed in a straight line pattern, a desired formation pattern of the glass frit units 21 can be easily obtained. Since the width of each of the glass frit units 21 is enough, the reliability of adhesion between the substrate 10 and the sealing member 20 can be improved. In addition, although a mesh shape of the screen mask 30 may remain on the glass frit units 21 when the glass frit units 21 are coated using a screen printing method.

Figure 8:
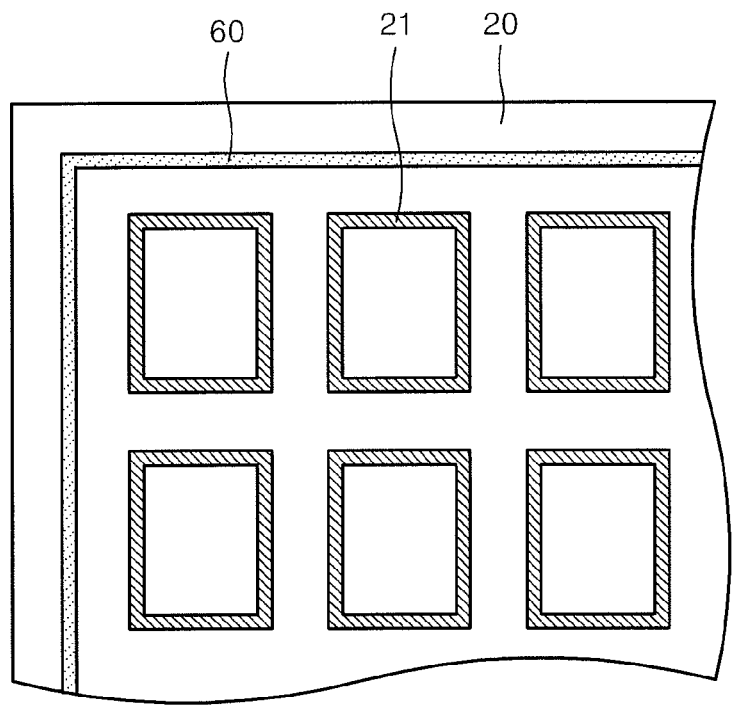
FIG. 8 is a schematic plan view illustrating a portion of an organic light emitting display apparatus according to an embodiment of the present invention.

FIG. 8 is a schematic plan view illustrating a portion of an organic light emitting display apparatus according to an embodiment of the present invention. A method of manufacturing the organic light emitting display apparatus according to the illustrated embodiment of the present invention further includes coating a sealant layer 60 on a sealing member 20. The sealant layer 60 is coated to surround a plurality of glass frit units 21. The sealant layer 60 may be an ultra violet curing sealant or the like.

Figure 9:
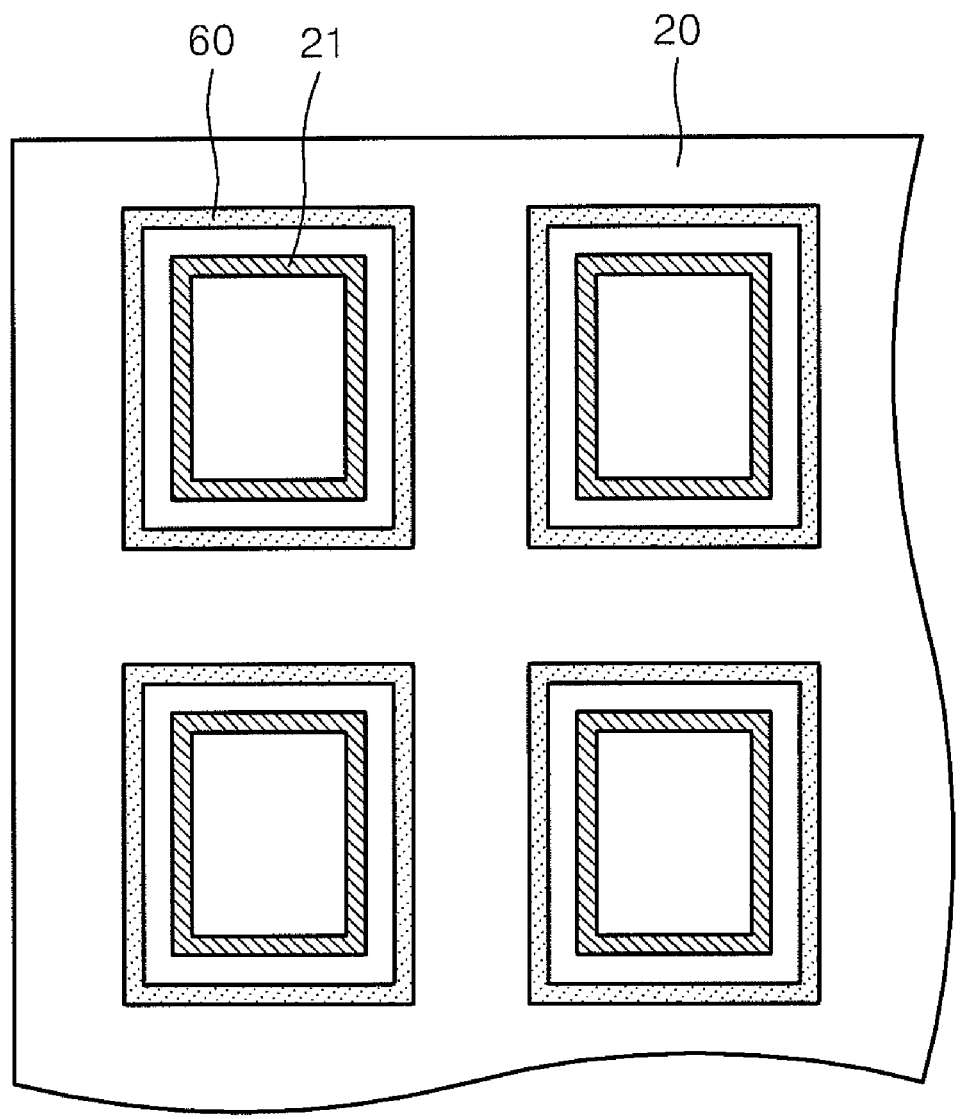
FIG. 9 is a schematic plan view illustrating an organic light emitting display apparatus according to an embodiment of the present invention.

FIG. 9 is a schematic plan view illustrating an organic light emitting display apparatus according to an embodiment of the present invention. Unlike FIG. 8, a plurality of sealant layers 60 surround a plurality of glass frit units 21, respectively. The organic light emitting display apparatuses of FIGS. 8 and 9 are sealed by the sealant layers 60 and are again sealed by the glass frit units 21. Accordingly, sealing efficiency can be improved. In particular, although the organic light emitting display apparatus shown in FIG. 9 are cut into each display device to have one of the display units 11, a double sealing can be maintained.

Using the organic light emitting display apparatus according to embodiments of the present invention and the method of manufacturing the same, an organic light emitting device can be easily sealed.

While embodiments of the present invention has been particularly shown and described, it will be understood by those of ordinary skill in the art that various changes in form and details may be made therein without departing from the spirit and scope of the present invention as defined by the following claims.

What is claimed is:

1. A method of making an organic light emitting display apparatus, the method comprising:
providing a first substrate comprising a first surface;
placing a mask over the first surface, wherein the mask comprises a patterned opening configured to pass a frit paste composition therethrough, wherein the patterned opening forms a closed loop, wherein the mask comprises a second surface facing away from the first surface of the first substrate;
wherein the mask comprises at least one additional patterned opening configured to pass the frit paste composition therethrough, wherein the at least one additional patterned opening forms a closed loop;
providing the frit paste composition on the second surface of the mask; and
pressing the frit paste composition such that the frit paste composition passes through the patterned opening and lands on the first surface of the first substrate to form a at least one structure of the frit paste composition in one or more closed loops on the first surface;
wherein the structure of the frit paste compositions comprises a third surface substantially parallel to the first surface of the first substrate, and wherein the third surface is substantially flat and free of a substantial bump or step.

2. The method of claim 1, wherein an organic light emitting display array is formed on the first surface of the first substrate, wherein the structure of the frit paste composition surrounds the organic light emitting display array.

3. The method of claim 1, further comprising:
providing a second substrate comprising a fourth surface;
providing an organic light emitting display array formed on the fourth surface; and
arranging the first and second substrates such that the organic light emitting display array faces the first substrate and that the structure of frit paste composition contacts the fourth surface.

4. The method of claim 1, wherein the mask comprises a sheet of screen with a plurality of meshes and a material formed on the sheet of screen, and wherein the material is to selectively block the plurality of meshes of the sheet of screen so as to form the patterned opening in the mask.

5. The method of claim 4, wherein the screen has about 200 to about 400 meshes per square inch.

6. The method of claim 1, further comprising heating the structure of the frit paste composition to form a solid frit integrated with the first substrate, wherein the solid frit comprises a fifth surface substantially parallel to the first surface of the first substrate, and wherein the fifth surface is substantially flat.

7. The method of claim 1, further comprising heating the structure of the frit paste composition to form a solid frit integrated with the first substrate, wherein the solid frit comprises a fifth surface, and wherein the fifth surface is substantially smooth.

8. The method of claim 1, further comprising heating the structure of the frit paste composition to form a solid frit structure integrated with the first substrate, wherein the solid frit comprises a fifth surface, and wherein the fifth surface is free of a substantial bump or step.

9. The method of claim 1, wherein the mask is placed over the first surface with a gap between the mask and the first surface.

10. The method of claim 9, wherein pressing the frit paste composition causes the frit paste composition to move into the gap.

11. The method of claim 1, wherein pressing comprises forming at least one additional structure of the frit paste composition in a closed loop on the first substrate.

* * * * *